US 6,573,220 B1

(12) United States Patent
Mannhart et al.

(10) Patent No.: US 6,573,220 B1
(45) Date of Patent: Jun. 3, 2003

(54) SUPERCONDUCTOR WITH ENHANCED CURRENT DENSITY AND METHOD FOR MAKING SUCH A SUPERCONDUCTOR

(76) Inventors: Jochen Dieter Mannhart, Edelweissring 46, D-86343, Koenigsbrunn (DE); Hartmut Ulrich Bielefeldt, Marconi-Str. 10, D-86179, Augsburg (DE); Barbel Martha Gotz, Agnes-Bernauer-Str. 52, D-86159, Augsburg (DE); Johannes Wilhelmus Maria Hilgenkamp, Boterbloem 7, NL-7623, CD Borne (NL); Andreas Fritz Albert Schmehl, Webersteng 20, D-86738, Deiningen (DE); Christof Walter Schneider, Tannen-Str. 3, D-86343, Koenigsbrunn (DE); Robert Ralf Schulz, Messerschmitt-Str. 336, D-86159, Augsburg (DE)

( * ) Notice: Subject to any disclaimer, the term of this patent is extended or adjusted under 35 U.S.C. 154(b) by 0 days.

(21) Appl. No.: 09/857,244
(22) PCT Filed: Nov. 12, 1999
(86) PCT No.: PCT/IB99/01823
§ 371 (c)(1),
(2), (4) Date: May 30, 2001
(87) PCT Pub. No.: WO00/33391
PCT Pub. Date: Jun. 8, 2000

(30) Foreign Application Priority Data

Dec. 3, 1998 (EP) ............................. 98122924

(51) Int. Cl.[7] .......................... H01F 6/00; H01L 33/00; H01L 39/00
(52) U.S. Cl. ........................ 505/126; 505/809; 505/780; 505/300
(58) Field of Search .................. 505/125, 126, 505/801, 809, 818, 780, 781, 300, 725

(56) References Cited

U.S. PATENT DOCUMENTS

| 5,660,774 | A | * | 8/1997 | Stangle et al. ................ 264/3.4 |
| 5,793,092 | A | * | 8/1998 | Habermeier et al. .......... 257/22 |
| 6,096,641 | A | * | 8/2000 | Kunikiyo .................... 438/304 |
| 6,121,205 | A | * | 9/2000 | Murakami et al. ........ 156/89.11 |

FOREIGN PATENT DOCUMENTS

EP 0 292 940 11/1988

OTHER PUBLICATIONS

Masutmoto et al. "Origin of the silver doping effects on superconducting ceramics," Appl. Phys. Lett. 56 (16), Apr. 16, 1990, pp. 1585–1587.*
Schatzle et al. "Melt processing of (Nd, Y)BaCucO and (Sm,Y)BaCuO composites," Supercond. Sci. Technol., 1996, 9, pp. 869–874.*
Saitoh et al., "Microstructures and superconducting properties of melt–processed (RE,RE')–Ba–Cu–O," Physica C 288, 1997, pp. 141–147.*

(List continued on next page.)

Primary Examiner—Tom Dunn
Assistant Examiner—Colleen P. Cooke
(74) Attorney, Agent, or Firm—Bachman & LaPointe, P.C.

(57) ABSTRACT

The present invention concerns an enhancement of the supercurrent carrying capabilities of bicrystalline or polycrystalline high-$T_c$ superconductors, i.e. the critical current densities in such superconductors. The current transport properties are improved by chemically altering, especially doping, the superconductors. It seems that a modification of the space-charge layers at the boundary, e.g. by an increase of the mobile charge carrier concentrations particularly in the superconductor's grain boundaries, which concentrations differ from those resulting in optimum superconducting properties of the grains, are responsible for this positive effect.

20 Claims, 1 Drawing Sheet

OTHER PUBLICATIONS

Matthews et al., "Melt–textured growth and characterization of a (Nd/Y)Ba2Cu3O(7–beta) composite cuperconductor with very high critical current density," Physica C 249 (1995), pp. 255–261.*

Habermeier et al., "Laser–induced voltages at room temperature in Pr doped Y–Ba–Cu–O thin films," Ins. Phys. Conf. Ser. No. 148, 1995, pp. 1023–1026.*

Selvam et al., "Enhanced Jc and improved grain–boundary properties in Ag–doped YBCO films," Appl. Phys. Lett. 71(1), Jul. 1, 1997, pp. 137–139.*

Sung et al., "Superconducting properties of doped–YBCO ultra thin films," Physica C 282–287 (1997), pp. 667–668.*

Liu et al., "Hole distribution in the underdoped, optimally doped, and overdoped superconductors (Ti0.5Pb0.5)Sr2(Ca1–xYx)Cu2O7," Physica C 282–287 (1997), pp. 981–982.*

Rohler et al., "Local structure study of the underdoped–overdoped transition in YBa2Cu3Ox (x=6.806–6.984) by yttrium EXAFS," Physica C 282–287 (1997), 182–185.*

Sung et al., "Properties of Doped–YBCO Bicrystal grain–boundary junctions for Josephson field effect transitistor," Physica C 282–287 (1997), pp. 2475–2476.*

Physica C, pp. 11–22, Apr. 20, 1997, entitled Growth and Superconductivity of $Bi_2Sr_2CA_{1-x}Y_xCu_2O_{8-6}$ Single Crystals in the $T_c$ Optimum Region, By G. Villard et al.

Materials Science & Engineering B, pp. 244–253, Aug. 29, 1997, entitled Doping of (Bi,Pb)–2223 with Metal Oxides, By D. Gohring et al.

Physica C, pp. 272–278, May 20, 1996, entitled Structural Aspects and Superconductivity in Oxygen–Deficient $Y_{1-x}Ca_xBa_2Cu_3O_{7-y}$ (y≈0.3) System a Neutron–Diffraction Study, By V.P.S. Awana et al.

Superconductor Science & Technology, pp. 308–310, entitled Enhancement of Critical Current Density in the Bi–Pb–Sr–Ca–Cu–O System of by Addition of $Ca_2CuO_3$, By S.X. Dou et al.

Enhancement of Transport Critical Current Density by GD Substitution in $YBa_2Cu_3O_7$, By Sastry et al., Apr. 25, 1988, pp. 1447–1448.

* cited by examiner

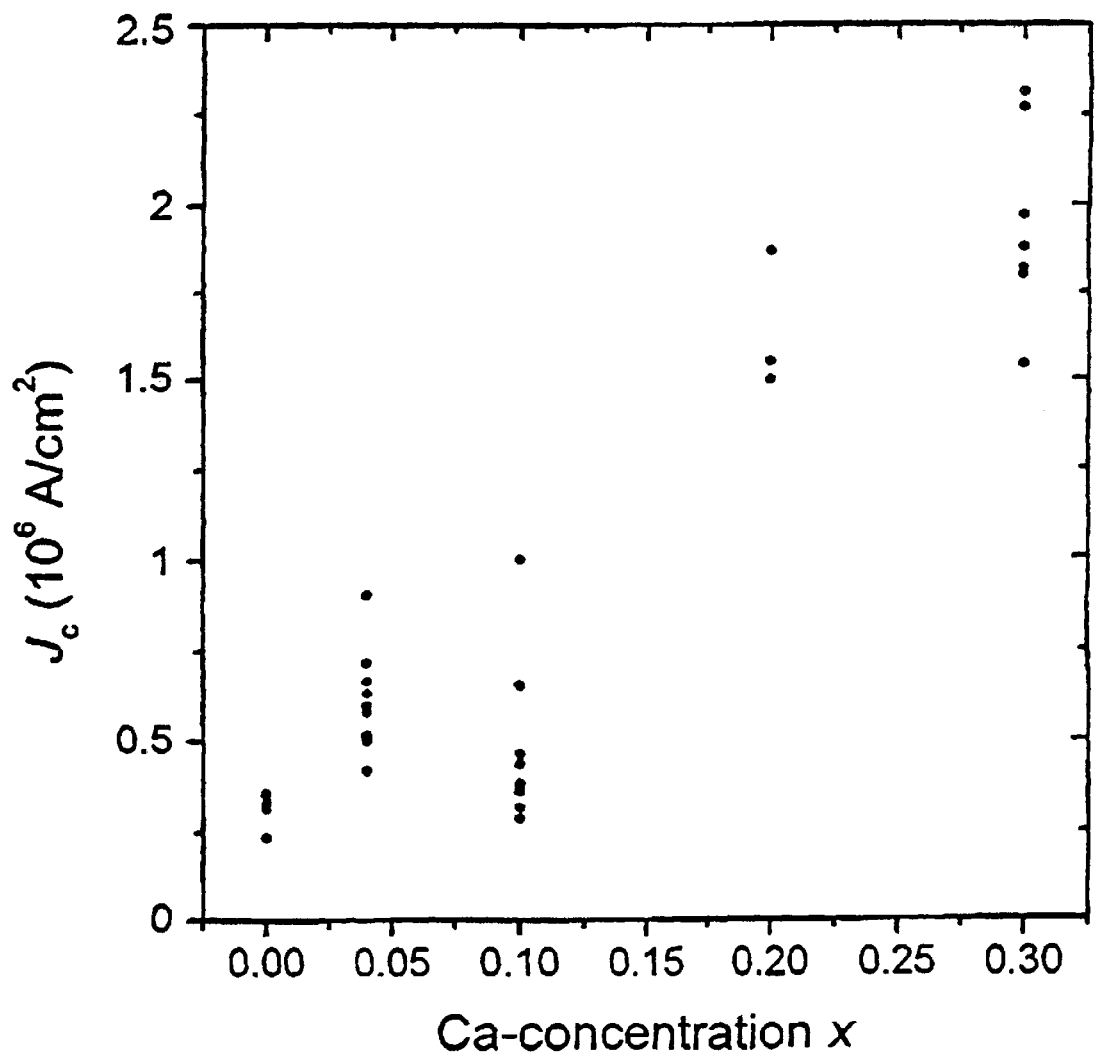

SUPERCONDUCTOR WITH ENHANCED CURRENT DENSITY AND METHOD FOR MAKING SUCH A SUPERCONDUCTOR

TECHNICAL FIELD

The present invention relates to the current carrying capabilities of superconductors and especially to the fact that the critical currents of many superconductors are limited by grain boundaries formed within such polycrystalline devices. The invention overcomes this limitation of present superconductors by using chemical alterations for improving the current transport properties of the superconductors' grain boundaries. With the aim of diminishing detrimental effects caused by space charge layers formed at the grain boundaries, this is done by doping the superconductors to dopant concentrations different from concentrations that would provide the optimum superconducting properties of the grains of the superconductors.

BACKGROUND OF THE INVENTION

Based on the new class of superconductors, henceforth referred to as high-$T_c$ superconductors, which were discovered by Bednorz and Muller and disclosed in their article "Possible High-$T_c$ Superconductivity in the Ba—La—Cu—O System", Zeitschrift für Physik B, Condensed Matter, Vol. B64, 1986, pp. 189–193, a variety of superconducting wires, cables and tapes have been developed for the transport of electrical current. A key parameter defining the performance and thus the economic benefit of these conductors is given by their so-called critical current density, which is the maximum density of the current these conductors can carry as supercurrents in the superconducting state. The critical current density is a specific property for a given superconductor and is aimed to be maximized for the practical use of the superconductor.

Chaudhari et al. have taught in their article "Direct Measurement of the Superconducting Properties of Single Grain Boundaries in $YBa_2Cu_3O_{7-\delta}$", Physical Review Letters, Vol. 60, 1988, pp. 1653–1655, that the limiting factor for the critical current density of polycrystalline high-$T_c$ superconductors is the electronic behavior of the boundaries formed by the crystalline grains of these materials. This group has shown that the critical current densities of these grain boundaries is smaller by one to two orders of magnitude than the critical current densities of the grains abutting the grain boundaries.

Further, Dimos et al. have taught in their publication "Superconducting transport properties of grain boundaries in $YBa_2Cu_3O_{7-\delta}$ Bicrystals", Physical Review B, Vol. 41, 1990, pp. 4038–4049, that the detrimental effect of the grain boundaries can be reduced by aligning the superconducting grains with respect to their crystalline main axis. Following this proposal, several groups are fabricating wires and tapes of high-$T_c$ superconductors, the critical currents of said wires and tapes are enhanced by aligning the superconducting grains by a variety of means, such as rolling processes or ion beam assisted techniques. Although these technologies have lead to the fabrication of high-$T_c$ superconductors with current densities of the order of 100000 A/cm$^2$ at temperatures of 4.2 K, it remains desirable to fabricate high-$T_c$ superconductors with still higher critical current densities or with processes which are less costly than the known ones.

The present invention now aims in a quite different direction to achieve the desired high current densities in high-$T_c$ superconductors. This different and novel approach according to the invention is—in brief—the teaching that the critical current densities of the grain boundaries in a high-$T_c$ superconductor, and therefore also of the polycrystalline conductors, can be enhanced by appropriate chemical doping of the superconductor.

Sung et al. describe in "Properties of Doped YBCO Bicrystal Grain-boundary Junctions for Josephson Field Effect Transistor", Physica C, Vol. 282–287, 1997, p.2475–2476 and Dong et al. in "Electric Field Effect in $Sm_{1-x}Ca_xBa_2Cu_3O_y$ Bicrystal Junctions", IEEE Transactions on Applied Superconductivity, Vol. 5, 1995, pps. 2879–2882, a method for optimizing the performance of superconducting three-terminal devices based on grain boundaries embodied into the devices. However, it is nowhere in this paper recognized, suggested, or made obvious for the person skilled in the art that the critical current density of the grain boundaries can be enhanced by appropriate doping.

As reported in "Enhanced $J_c$ and improved grain-boundary properties in Ag doped $YBa_2Cu_3O_{7-\delta}$ films", Appl. Phys. Lett., Vol. 71, 1997, pp. 137–139, Selvam et al. investigated the effect of adding silver on the critical current density of $YBa_2Cu_3O_{7-\delta}$ films. These researchers found that the addition of silver enhances the size of the superconducting grains and their alignment, and because of these structural changes increases the overall critical current density of the conductor.

Ivanov et al. report in "Properties of locally doped bi-crystal grain boundary junctions", Physica B, Vol. 194–196, 1994, pp. 2187–2188, experiments in which they investigated the effects of Fe and Pt embedded into grain boundaries in $YBa_2Cu_3O_{7-\delta}$ films on the transport properties of these grain boundaries. In this work, a strong reduction of the critical current density was observed.

Also, the doping of grains in various high-$T_c$ superconductors was reported by several groups, e.g. by M. Muralidhar and M. Murakami in their article "Effect on Gd Addition on the Superconducting Properties of (Nd—Sm—Eu) 123 System", Applied Superconductivity, Vol. 5, 1997, pp. 127–131, or by T. W. Li et al. in their article "Enhanced flux pinning in Bi-2212 single crystals by planar defects introduced via Ti-substitution ", Physica C, Vol. 274, 1997, pp 197–203. However, these efforts are aimed at increasing the pinning forces acting on Abrikosov vortices, which are only present within the grains. Therefore these experiments only affect the superconducting properties of the grains. An effect on the critical current densities of the grain boundaries was not reported, and probably not investigated.

SUMMARY OF THE INVENTION

A general objective of this invention is to provide a solution for an increased use of high-$T_c$ materials by a better understanding of the current transport mechanisms within such materials, in particular of the upper limits of the current transport.

A specific objective, as mentioned above, is to provide an approach by which the current carrying capabilities of conductors, e.g. wires, made from high-$T_c$ superconductors can be significantly improved.

Another objective of the invention is to provide a technique for a simpler manufacturing process, resulting in cheaper mass production of polycrystalline high-$T_c$ superconductors with large critical current densities. At present, the fabrication of such superconductors requires cumbersome and costly processes to optimize the grain boundary geometries, such as improving their alignment or enhancing the effective grain boundary area.

A still further objective is to provide an approach for reducing the sensitivity of the critical current densities of polycrystalline high-$T_c$ superconductors to magnetic fields, which often exist in the environment in which the superconductor is operated or which are induced by the supercurrents themselves. At present, the critical current densities of high-$T_c$ superconductors are easily suppressed by such fields, which poses a severe problem for all applications in which the superconductors must be operated in magnetic fields, such as superconducting magnets or superconducting cables.

In brief, the solution taught by the invention is based on a novel understanding of the transport mechanism within polycrystalline high-$T_c$ superconductors and consists in chemically doping the superconductors. This is done to modify space charge layers formed at the grain boundaries, e.g. by changing the density of the superconductor's charge carriers in an uncommon way. By this, the current transport properties of the grain boundaries—not those of the grains—within the high-$T_c$ material are optimized and thus the specific objective of this invention achieved.

The herefore used concentrations of dopant ions differ substantially from the concentration levels typically used to fabricate polycrystalline high-$T_c$ conductors. The reason is that the standard approach was to optimize the superconducting properties of the grains and not those of the grain boundaries. The novel approach according to the invention now changes this picture and the understanding of the current transport mechanism in high-$T_c$ materials, especially with regard to the maximum (or critical) current density in such materials.

Another advantage of the approach according to the invention is that it simplifies manufacturing processes and allows cheaper mass production of polycrystalline high-$T_c$ superconductors with large critical current densities, since it reduces the complexity of steps and processes which are often used today for optimizing the geometries of the grain boundaries, as mentioned above.

A still further advantage is the fact that the critical current densities of high-$T_c$ superconductors according to the invention show a reduced sensitivity to magnetic fields which quite often exist in the vicinity of the superconductor, either from other sources or induced by the supercurrents themselves. Thus, superconductors according to the invention can be securely and efficiently operated in environments where strong magnetic fields are abundant, such as superconducting magnets or superconducting cables.

BRIEF DESCRIPTION OF THE DRAWING

The FIGURE is a graph depicting the dependence of the grain boundary critical current density $J_c$ of symmetric 24° [001]-tilt grain boundaries in $Y_{1-x}Ca_xBa_2Cu_3O_{7-\delta}$ films on $SrTiO_3$ bicrystals, measured at a temperature of 4.2 K as a function of the Ca concentration x.

DESCRIPTION OF EXAMPLES/EMBODIMENTS

Studies of single grain boundaries performed and published by the inventors in "Superconducting and normal-state properties of $YBa_2Cu_3O_{7-\delta}$ bicrystal grain boundary junctions in thin films", Appl. Phys. Lett. Vol. 73, 1998, pp. 265–267, have lead to a better understanding of the processes which limit the critical current densities of these grain boundaries.

Based on this understanding, it was recognized that the critical current density of the grain boundaries may be enhanced by chemically doping the high-$T_c$ superconductors to change the density of their electronic charge carriers to levels which are non-optimal for the superconducting properties of the grains. It was found that chemical dopants exist, e.g. Ca for $YBa_2Cu_3O_{7-\delta}$ films, which improve the critical current densities of the grain boundaries and lower their normal state resistance.

As it are the critical current densities of the grain boundaries and not the critical current densities of the grains which limit the critical current density of the polycrystalline superconductor, the detrimental effect of the doping on the superconducting properties of the superconducting grains bears no negative effect on the critical current density of the polycrystalline superconductors, provided the doping is done such that the grain critical current density still exceeds the grain boundary critical current density.

It is known, that the superconducting properties of high-$T_c$ superconductors, such as their critical temperatures or their critical current densities, are improved by thermal anneals at elevated temperatures in well-defined atmospheres, such as oxygen or air, in order to adjust the oxygen content and the oxygen distribution in the superconductor. A preferred way to exploit the beneficial effects of the doping is to adjust the oxygen concentration of the superconductors by choosing appropriate annealing procedures for each dopant concentration. For example, to take the best advantage of the improvement of the critical current density by 30% of Ca-doping of $Y_1Ba_2Cu_3O_{7-\delta}$ films, these films may be annealed after fabrication by an additional annealing step in 1 bar of $O_2$ at a temperature of 420° C. for 20 minutes.

Guided by the new understanding and vision, a series of samples consisting of $Y_{1-x}Ca_xBa_2Cu_3O_{7-\delta}$ films was fabricated. In these films, a well defined grain boundary with a 24° [001]-tilt misorientation was embedded by means of the so called bicrystal technique using pulsed laser deposition, as described in Appl. Phys. Lett. Vol. 73, 1998, pp. 265–267. In the $Y_{1-x}Ca_xBa_2Cu_3O_{7-\delta}$ films, the Ca substitution is used as a means of doping to enhance the carrier concentration of the well known superconductor $YBa_2Cu_3O_{7-\delta}$ into the so-called overdoped regime. In doing this, the depositions and annealing procedures were carefully optimized for the growth of the $Y_{1-x}Ca_xBa_2Cu_3O_{7-\delta}$ films. These films were grown in an oil-free UHV-type vacuum system using oxygen gas with a purity of 99.9999% and a pressure of 0.25 mbar, target materials with a purity of 99.999%, heater temperatures of 760° C. stabilized to within 2° C., laser pulses of an energy density of 2.2 J/cm$^2$ at 248 nm and a cooldown procedure at 0.4 bar of oxygen including an annealing step of 12 minutes at 400° C. The parameters were optimized in this way to ensure that the measured critical current densities were not influenced by artifacts, but instead revealed the maximum values of the critical current densities attainable for the grain boundaries.

The critical current densities measured this way were significantly larger than the values reported by Ivanov, Sung or Dong mentioned above, which therefore did not show the current density that can be carried by the grain boundaries.

After growth and annealing, the films were patterned by standard photolithographic means in a way that the critical current density of the grain boundaries could be measured by transport measurements. In the FIGURE, the critical current densities of these samples are plotted as function of the Ca concentration. As can be seen clearly, for the range of doping concentrations investigated, the critical current density of the samples was strongly enhanced by the addition of calcium. In fact, the values achieved in this process were as large as 2 300 000 A/cm$^2$ at a temperature of 4.2 K, and therefore exceeded the current densities of the undoped samples measured in the experiment, 300000 A/cm$^2$ at a temperature of 4.2 K, by more than a factor of five. Further, the critical current densities of the doped samples surpass by far the best value found in the literature, 850000 A/cm$^2$ at a temperature of 4.2 K (Gross and Mayer, Physica C, Vol. 180, 1991, pp. 235–242), for 240 boundaries in YBa$_2$Cu$_3$O$_{7-\delta}$ films.

Thus, the technologically rather simple and inexpensive addition of Ca to polycrystalline YBa$_2$Cu$_3$O$_{7-\delta}$ superconductors definitely enhances the critical current density in such superconductors substantially.

In addition, evidence was found that adding Ca to polycrystalline YBa$_2$Cu$_3$O$_{7-\delta}$ superconductors decreases the sensitivity of the critical current densities of the grain boundaries on magnetic fields, probably by strengthening the electronic coupling across the grain boundaries. Therefore, such superconductor can carry significant supercurrents even in large magnetic fields, which offers large advantages for the application of such materials for the fabrication of wires or magnets.

Also, measurements have revealed a further advantage. It was found that the Ca doping of polycrystalline YBa$_2$Cu$_3$O$_{7-\delta}$ superconductors decreases the normal state resistivity of the superconductor from values of 10$^{-8}$ Ωcm$^2$ for undoped YBa$_2$Cu$_3$O$_{7-\delta}$ to 4×10$^{-10}$ Ωcm$^2$ for Y$_{1-x}$Ca$_x$Ba$_2$Cu$_3$O$_{7-\delta}$ films with x=0.3. The "normal state resistivity" is the resistivity shown by the superconductor if it is biased with electric currents which exceed its critical current. As revealed by the measurements, doping can thus be used to tune the normal state resistance of high-T$_c$ superconductors. This offers considerable advantages for the use of such materials in applications in which the normal state resistance plays a role, e.g. affects the performance of the application. Examples for such applications are wires and tapes, or fault current limiters, which, if switched into the normal state, have to suppress an electrical current as efficiently as possible.

There is no doubt that other materials than Ca can be used to achieve the same basic effect as dopant, and that also the critical current densities of grain boundaries in other high-T$_c$ superconducting compounds than YBa$_2$Cu$_3$O$_{7-\delta}$ can be increased as well. These compounds are well known to those skilled in the art and a list of them has been published for example by Park and Snyder in "Structures of High-Temperature Cuprate Superconductor", J. Am. Ceram. Soc., Vol. 78, 1995, pp. 3171–3194. Examples for such cases are provided in the following.

For YBa$_2$Cu$_3$O$_{7-\delta}$ and similarly for all REBa$_2$Cu$_3$O$_{7-\delta}$ superconductors, where RE stands for an element belonging to the rare earths, which are preferred superconducting compounds to be used for high-T$_c$ superconducting tapes, besides doping by Ca, doping by Sr or Bi or a combination of those can be used to enhance the critical current density of the grain boundaries.

Other high-T$_c$ compounds of choice, which are presently exploited for the fabrication of superconducting wires, are the members of the so-called Bi-compounds, characterized by a stoichiometry of Bi$_m$Sr$_2$Ca$_{n-1}$Cu$_n$O$_{2n+m+2+\delta}$ with m=1, 2, and n=1, 2, 3 or 4. In these materials, doping e.g. by Y, La, Sc, Ca, and/or Ba can be used to increase the critical current density of the grain boundaries.

Still other high-T$_c$ compounds of choice, which are of interest for the fabrication of superconducting wires, are the members of the so-called Tl-compounds, characterized by a stoichiometry of Tl$_m$Ba$_2$Ca$_{n-1}$Cu$_n$O$_{2n+m+2+\delta}$ with m=1, 2, and n=1, 2, 3 . . . In these materials, doping e.g. by Ca, Y, La, Sc, and/or Sr can be used to increase the critical current density of the grain boundaries.

Still other high-T$_c$ compounds of choice, which are also of interest for the fabrication of superconducting wires, are the members of the so-called Hg-compounds, characterized by a stoichiometry of Hg$_m$Ba$_2$Ca$_{n-1}$Cu$_n$O$_{2n+m+2+\delta}$ with m=1, 2, and n=1, 2, 3 . . . In these materials, doping e.g. by Y, La, Sc, and/or Sr can be used to increase the critical current density of the grain boundaries.

Still other high-T$_c$ compounds of choice, which are also of interest for the fabrication of superconducting wires, are the members of the so-called Cu-compounds, characterized by a stoichiometry of Cu$_m$Ba$_2$Ca$_{n-1}$Cu$_n$O$_{2n+m+2+\delta}$ with m=1, 2, and n=1, 2, 3 . . . In these materials, doping e.g. by Y, La, Sc, and/or Sr can be used to increase the critical current density of the grain boundaries.

Based on the above, a person skilled in the art can easily vary the values and materials given above as examples and adapt them to other implementations without departing from the inventive gist as defined in the appended claims.

What is claimed is:

1. Method for making a long superconductor with a high critical current density from a bicrystalline or polycrystalline superconductor of the family of the high-T$_c$ cuprates, characterized by doping said superconductor by chemically substituting between 10 and 90% of the cations in said superconductor's stoichiometry to achieve the desired high critical current density in said superconductor's grain boundaries.

2. The method for making a superconductor according to claim 1, wherein the doping is carried out by mixing the compounds appropriate for the stoichiometry desired, including the dopant, before a final sintering step.

3. The method for making a superconductor according to claim 1, characterized by overdoping said superconductor to achieve a concentration of mobile carriers of up to 300% of the undoped superconductor's mobile carrier concentration.

4. The method for making a superconductor according to claim 1, characterized by underdoping said superconductor to achieve a concentration of mobile carriers of more than about 30% of the undoped superconductor's mobile carrier concentration.

5. The method for making a superconductor according to claim 1, wherein the desired critical current density of the grain boundaries is achieved by doping the superconductor with at least one element of the series Ca, Sr, Ba, Y, Mg, H, Li, Tl, and/or Pb.

6. The method for making a superconductor according to claim 5, wherein the desired critical current density of the grain boundaries is achieved by incorporating Ca into a YBa$_2$Cu$_3$O$_{7-\delta}$ superconductor.

7. The method for making a superconductor according to claim 5, wherein the desired critical current density of the grain boundaries is achieved by incorporating Ca and/or Sr into a YBa$_2$Cu$_3$O$_{7-\delta}$ superconductor.

8. The method for making a superconductor according to claim 5, wherein
the desired critical current density of the grain boundaries is achieved by incorporating Ba and/or Y into a $Bi_2Sr_2Ca_1Cu_2O_{8+\delta}$ or a $Bi_2Sr_2Ca_2Cu_3O_{10+\delta}$ superconductor.

9. The method for making a superconductor according to claim 1, wherein
the desired effect of the doping is optimized by an oxygen annealing step.

10. The method for making a superconductor according to claim 1, wherein
the doping is controlled such that the dopant concentration achieved in the grain boundaries differs from the dopant concentration in the grains.

11. The method for making a superconductor according to claim 1, wherein
the doping is controlled such that the superconductor's normal state resistivity is tuned to achieve desired values.

12. A bicristalline or polycrystalline long superconductor, e.g. a superconducting tape or wire, with high critical current density of the family of the high-$T_c$ cuprates, characterized by
a dopant chemically substituting between 10 and 90% of said superconductor's cations, thereby enhancing said critical current density of said superconductor by increasing the critical current density of the grain boundaries in said superconductor.

13. The superconductor according to claim 12, wherein
the grain boundaries exhibit a concentration of the dopant chemically substituting up to 90% of the cations in said grain boundaries.

14. The superconductor according to claim 12, wherein
the dopant substitutes between 10 and 90% of the cations in said superconductor's stoichiometry thus achieving the desired dopant concentration in the grain boundaries.

15. The superconductor according to claim 12, wherein
the dopant is at least one element of the series Ca, Sr, Ba, Y, Mg, H, Li, Tl, and/or Pb.

16. The superconductor according to claim 12, characterized by
grain boundaries having a dopant concentration different from the dopant concentration in the grains.

17. Method for making a long superconductor with a high critical current density from a bicrystalline or polycrystalline superconductor of the family of the high-$T_c$ cuprates, characterized by
doping said superconductor by chemically substituting about 50% of the cations in said superconductor's stoichiometry to achieve the desired high critical current density in said superconductor's grain boundaries.

18. A bicristalline or polycrystalline long superconductor, e.g. a superconducting tape or wire, with high critical current density of the family of the high-$T_c$ cuprates, characterized by
a dopant chemically substituting about 50% of said superconductor's cations, thereby enhancing said critical current density of said superconductor by increasing the critical current density of the grain boundaries in said superconductor.

19. The superconductor according to claim 12, wherein
the grain boundaries exhibit a concentration of the dopant chemically substituting preferably about 50% of the cations in said grain boundaries.

20. The superconductor according to claim 12, wherein
the dopant substitutes about 50% of the cations in said superconductor's stoichiometry thus achieving the desired dopant concentration in the grain boundaries.

* * * * *